(12) United States Patent
Moon et al.

(10) Patent No.: US 12,733,351 B2
(45) Date of Patent: Sep. 8, 2026

(54) DISPLAY DEVICE AND METHOD OF MANUFACTURING THE SAME

(71) Applicant: Samsung Display Co., Ltd., Yongin-Si (KR)

(72) Inventors: Sunggwon Moon, Yongin-si (KR); Donghan Kang, Yongin-si (KR); Jeehoon Kim, Yongin-si (KR); Shinhyuk Yang, Yongin-si (KR); Woogeun Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 364 days.

(21) Appl. No.: 18/539,271

(22) Filed: Dec. 14, 2023

(65) Prior Publication Data

US 2024/0224614 A1 Jul. 4, 2024

(30) Foreign Application Priority Data

Jan. 4, 2023 (KR) ........................ 10-2023-0001270

(51) Int. Cl.

*H10K 59/122* (2023.01)
*H10K 59/12* (2023.01)
*H10K 59/124* (2023.01)
*H10K 59/131* (2023.01)

(52) U.S. Cl.

CPC ....... *H10K 59/122* (2023.02); *H10K 59/1201* (2023.02); *H10K 59/124* (2023.02); *H10K 59/131* (2023.02)

(58) Field of Classification Search

CPC .. H10K 50/824; H10K 59/122; H10K 59/124; H10K 59/131

See application file for complete search history.

(56) References Cited

U.S. PATENT DOCUMENTS

| | | | | |
|---|---|---|---|---|
| 9,786,731 | B2 * | 10/2017 | Matsuura | H10K 59/131 |
| 10,403,845 | B2 | 9/2019 | Lee et al. | |
| 2017/0062755 | A1 * | 3/2017 | Im | H10K 50/824 |
| 2017/0317154 | A1 * | 11/2017 | Heo | H10K 59/1315 |
| 2019/0115403 | A1 * | 4/2019 | Kang | H10D 30/6723 |
| 2019/0172898 | A1 * | 6/2019 | Choi | H10K 59/122 |
| 2019/0189717 | A1 * | 6/2019 | Choi | H10K 59/122 |

(Continued)

FOREIGN PATENT DOCUMENTS

| | | | | |
|---|---|---|---|---|
| KR | 10-2021-0086869 A | | 7/2021 | |
| KR | 10-2022-0069361 A | | 5/2022 | |
| TW | I759046 B | * | 3/2022 | H10K 59/1315 |

*Primary Examiner* — Evren Seven

(74) *Attorney, Agent, or Firm* — Innovation Counsel LLP

(57) ABSTRACT

A display device includes an interlayer insulating layer exposing an auxiliary line, a protection layer disposed on the interlayer insulating layer and removed from an area above the auxiliary line, a pixel defining layer disposed on the protection layer and including a first portion covering one side surfaces of the protection layer and the interlayer insulating layer and a second portion protruding toward the first portion beyond an edge of other side surfaces of the interlayer insulating layer and the protection layer and defining a undercut area, a light emitting layer covering the first portion of the pixel defining layer and exposing the auxiliary line in the undercut area, and a cathode electrode disposed on the light emitting layer and contacting the auxiliary line in the undercut area.

11 Claims, 11 Drawing Sheets

(56) References Cited

U.S. PATENT DOCUMENTS

2020/0185480 A1* 6/2020 Heo .................. H10K 59/1315
2022/0231240 A1* 7/2022 Lee ...................... H10K 59/122
2023/0189570 A1* 6/2023 Lin ................. H10K 59/80521
257/40

* cited by examiner

EA
NEA
PDL:PDL-P1,PDL-P2,PDL-P3
A
UA
PDL-P2
UO
PDL-P1
LD
ADE EML CTE
DE
SE ACT GE BML1
TFT
CE GI2 BML2 AL
AU
DD
PDL-P3
VIA
GI1
PVX
ILD
BUF
SUB

DISPLAY DEVICE AND METHOD OF MANUFACTURING THE SAME

CROSS-REFERENCE TO RELATED APPLICATION

This application claims priority, under 35 USC § 119, to Korean Patent Application No. 10-2023-0001270 filed on Jan. 4, 2023 in the Korean Intellectual Property Office, the content of which is herein incorporated by reference in its entirety.

BACKGROUND

1. Field

The present disclosure relates to a display device and a method for manufacturing the display device. More particularly, the present disclosure relates to a display device that provides visual information and a method of manufacturing the display device.

2. Description of the Related Art

With the development of information technology, a display device, which is a connection medium between a user and information, has become increasingly important. For example, the use of display devices such as liquid crystal display device ("LCD"), organic light emitting display device ("OLED"), plasma display device ("PDP"), quantum dot display device or the like is increasing.

The display device includes light emitting elements, and the light emitting elements include a cathode electrode. As the size of the display device increases, display quality of the display device may deteriorate due to a drop in voltage provided to the cathode electrode. Accordingly, a structure for preventing the drop in voltage provided to the cathode electrode is being developed.

SUMMARY

The present disclosure pertains to a display device with improved display quality.

The present disclosure also pertains to a method of manufacturing the display device.

A display device includes a substrate, an auxiliary line disposed on the substrate, an interlayer insulating layer covering an edge of the auxiliary line, the interlayer insulating layer being removed from an area above the auxiliary line and including a first side surface and a second side surface facing each other, a protection layer disposed on the interlayer insulating layer and removed from an area above the auxiliary line, and the protection layer including a first protection side surface and a second protection side surface facing each other, a pixel defining layer disposed on the protection layer and including a first portion covering the first protection side surface of the protection layer and partially covering the first side surface of the interlayer insulating layer and a second portion protruding toward the first portion beyond an edge of the second side surface of the interlayer insulating layer and an edge of the second protection side surface of the protection layer and defining an undercut area with the second side surface of the interlayer insulating layer and the second protection side surface of the protection layer, a light emitting layer covering the first portion of the pixel defining layer and contacting a first part of the auxiliary line while leaving a second part of the auxiliary line in the undercut area free of the light emitting layer, and a cathode electrode disposed on the light emitting layer, extending to the undercut area, and contacting the auxiliary line in the undercut area.

A sum of a thickness of the interlayer insulating layer and a thickness of the protection layer may be greater than a thickness of the light emitting layer.

An inclination angle formed between the second side surface of the interlayer insulating layer and the auxiliary line may be different from an inclination angle formed between the second protection side surface of the protection layer and the auxiliary line.

Each of the interlayer insulating layer and the protection layer may include at least of silicon nitride ($SiN_x$), silicon oxide ($SiO_2$), and silicon oxynitride (SiON).

The interlayer insulating layer and the protection layer may include an inorganic material different from each other.

The interlayer insulating layer and the protection layer may include a same inorganic material as each other.

The first portion of the pixel defining layer may be spaced apart from an upper surface of the auxiliary line.

The light emitting layer may extend to at least a part of an upper surface of the auxiliary line and contact a part of the first side surface of the interlayer insulating layer.

The auxiliary line may include a first conductive layer and a second conductive layer disposed on the first conductive layer, and each of the first conductive layer and the second conductive layer may include a metal.

The auxiliary line may further include a third conductive layer disposed on the second conductive layer, and the third conductive layer may include a metal oxide.

A width of a protruding part of the second portion of the pixel defining layer defining the undercut area may be about 0.1 micrometers to about 5.0 micrometers.

A method of manufacturing a display device includes forming an auxiliary line on a substrate, forming a plurality of insulating layers on the substrate, forming a first preliminary layer and a second preliminary layer by removing a part of the plurality of insulating layers covering the auxiliary line through a first etching process, forming a pixel defining layer including a first portion on the second preliminary layer and covering one side surface of each of the first and second preliminary layers and a second portion on the second preliminary layer, forming an interlayer insulating layer and a protection layer exposing a part of the auxiliary line by removing a part of the first preliminary layer contacting the auxiliary line through a second etching process, wherein one side surface of each of the interlayer insulating layer and the protection layer adjacent to the second portion of the pixel defining layer defines an undercut area with the second portion of the pixel defining layer, forming a light emitting layer covering the first portion of the pixel defining layer, extending to the auxiliary line, and exposing the auxiliary line in the undercut area, and forming a cathode electrode disposed on the light emitting layer, extending to the undercut area, and contacting e auxiliary line in the undercut area.

The removing of the plurality of insulating layers by the first etching process comprises forming the first preliminary layer to cover the upper surface of the auxiliary line.

A sum of a thickness of the interlayer insulating layer and a thickness of the protection layer may be greater than a thickness of the light emitting layer.

An inclination angle formed between the one side surface adjacent to the second portion of the pixel defining layer and the auxiliary line may be different from an inclination angle formed between the one side surface adjacent to the second portion of the pixel defining layer and the auxiliary line.

The first portion of the pixel defining layer may be spaced apart from an upper surface of the auxiliary line.

A side surface of the interlayer insulating layer adjacent to the first portion of the pixel defining layer may be partially covered by the first portion of the pixel defining layer, and the light emitting layer may extend to at least a part of an upper surface of the auxiliary line to contact the side surface of the interlayer insulating layer exposed by the first portion of the pixel defining layer.

Each of the interlayer insulating layer and the protection layer may include at least one of silicon nitride ($SiN_x$), silicon oxide ($SiO_2$), and silicon oxynitride (SiON).

The interlayer insulating layer and the protection layer may include an inorganic material different from each other.

The interlayer insulating layer and the protection layer may include a same inorganic material as each other.

In a display device according to an embodiment of the present disclosure, the sum of a thickness of an interlayer insulating layer and a thickness of a protection layer may be greater than a thickness of a light emitting layer. Accordingly, a cathode electrode may contact an auxiliary line without being blocked by the light emitting layer.

A method of manufacturing a display device according to an embodiment of the present disclosure may include forming a first preliminary layer to cover the upper surface of the auxiliary line by not removing a part of a first insulating layer overlapping a part of the auxiliary line. Accordingly, the auxiliary line may be protected from moisture and oxygen.

BRIEF DESCRIPTION OF THE DRAWINGS

Illustrative, non-limiting embodiments will be more clearly understood from the following detailed description in conjunction with the accompanying drawings.

DETAILED DESCRIPTION OF THE EMBODIMENTS

Figure 1:
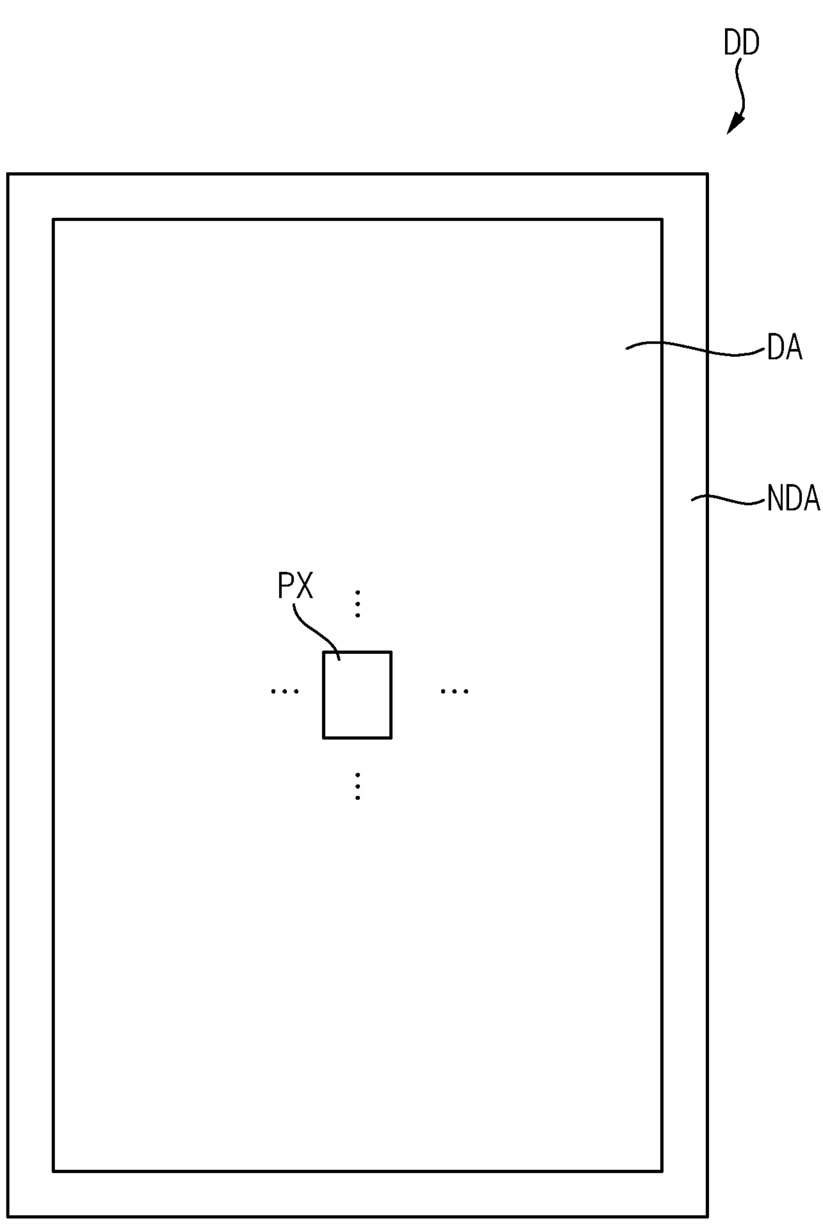
FIG. 1 is a plan view illustrating a display device according to an embodiment of the present disclosure.

Hereinafter, embodiments of the present disclosure will be described in detail with reference to the accompanying drawings. The same reference numerals are used for the same components in the drawings, and redundant descriptions of the same components will be omitted.

FIG. 1 is a plan view illustrating a display device according to an embodiment of the present disclosure.

Referring to FIG. 1, a display device DD may include a display area DA and a non-display area NDA. The display area DA may be an area displaying an image. The non-display area may be an area not displaying an image. The non-display area NDA may be positioned around the display area DA. For example, the non-display area NDA may entirely surround the display area DA.

A plurality of pixels PX for generating an image may be disposed in the display area DA. The display area DA may include a light emitting area (e.g., a light emitting area EA of FIG. 4) and a non-light emitting area (e.g., a non-light emitting area NEA of FIG. 4). The image may be generated by combining light emitted from each of the pixels PX in the light emitting area. An auxiliary unit (e.g., an auxiliary unit AU of FIG. 4) may be disposed in the non-light emitting layer to assist a cathode electrode (e.g., a cathode electrode CTE of FIG. 4).

Figure 2:
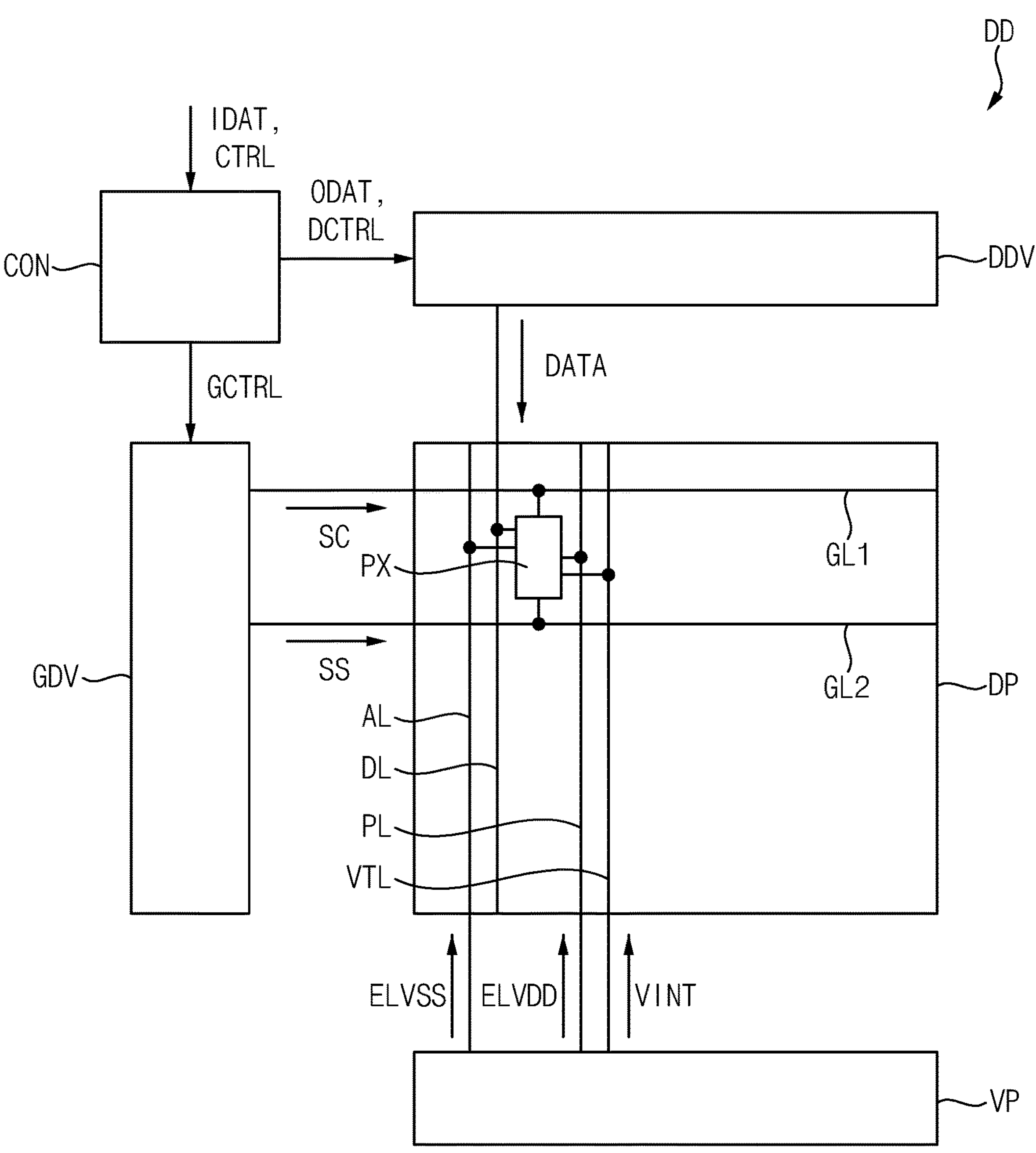
FIG. 2 is a block diagram for describing the display device of FIG. 1.

FIG. 2 is a block diagram for describing the display device of FIG. 1.

Referring to FIG. 2, the display device DD may include a display panel DP, a data driver DDV, a gate driver GDV, a controller CON, and a voltage supplier VP.

The display panel DP may include at least one pixel PX. The pixel PX may receive a first gate signal SC through a first gate line GL1 and receive a second gate signal SS through a second gate line GL2. In addition, the pixel PX may receive a data voltage DATA through a data line DL and receive an initialization voltage VINT through the initialization voltage line VTL. The data voltage DATA may be applied to the pixel PX in response to the first gate signal SC, and the initialization voltage VINT may be applied to the pixel PX in response to the second gate signal SS.

The data driver DDV may generate the data voltage DATA based on an output image data ODAT and a data control signal DCTRL. For example, the data driver DDV may generate the data voltage DATA corresponding to the output image data ODAT and output the data voltage DATA in response to the data control signal DCTRL. The data control signal DCTRL may include an output data enable signal, a horizontal start signal, and a load signal.

The gate driver GDV may generate the first gate signal SC and the second gate signal SS based on a gate control signal GCTRL. For example, each of the first gate signal SC and the second gate signal SS may include a gate-on voltage for turning on a transistor and a gate-off voltage for turning off the transistor. The gate control signal GCTRL may include a vertical start signal and a clock signal.

The controller CON (e.g., timing controller) may receive an input image data IDAT and a control signal CTRL from an external host processor (e.g., GPU). For example, the input image data IDAT may be RGB data including red image data, green image data, and blue image data. The control signal CTRL may include a vertical synchronization signal, a horizontal synchronization signal, an input data enable signal, a master clock signal, etc. The controller CON may generate the gate control signal GCTRL, the data control signal DCTRL, and the output image data ODAT based on the input image data IDAT and the control signal CTRL.

The voltage supplier VP may provide a driving voltage ELVDD, a common voltage ELVSS, and the initialization voltage VINT to the pixel PX. The driving voltage ELVDD may be provided to the pixel PX through a driving line PL. The common voltage ELVSS may be provided to the pixel PX through an auxiliary line AL and the cathode electrode (e.g., the cathode electrode CTE of FIG. 4).

Figure 3:
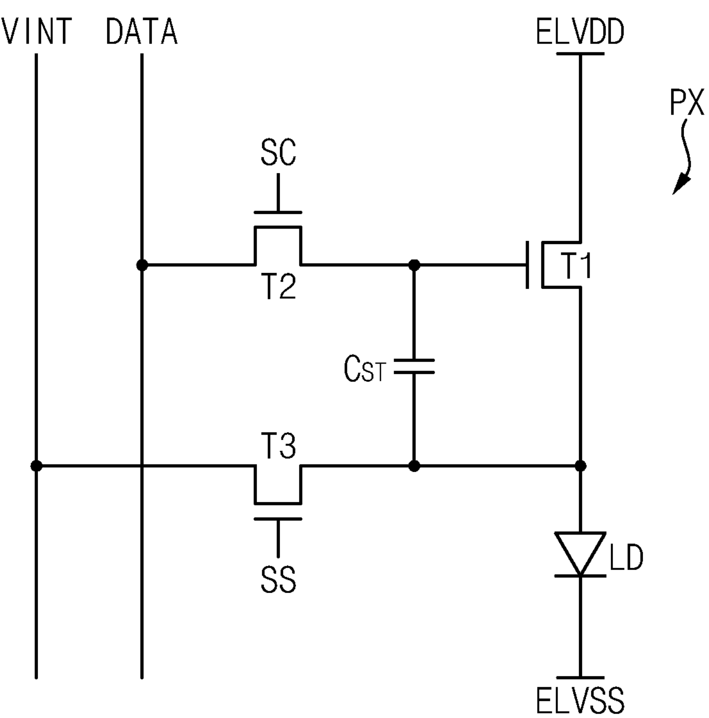
FIG. 3 is a circuit diagram for describing a pixel included in the display device of FIG. 2.

FIG. 3 is a circuit diagram for describing a pixel included in the display device of FIG. 2.

Referring to FIG. 3, the pixel PX may include a first transistor T1, a second transistor T2, a third transistor T3, a storage capacitor CST, and a light emitting element LD.

However, the present disclosure is not limited thereto. That is, some of the components of the pixel PX may be omitted and other components may be added.

The first transistor T1 may include a first electrode, a second electrode, and a gate electrode. The first electrode may receive the driving voltage ELVDD. The second electrode may be connected to the light emitting element LD. The gate electrode may be connected to the second transistor T2. The first transistor T1 may generate a driving current based on the driving voltage ELVDD and the data voltage DATA.

The second transistor T2 may include a first electrode, a second electrode, and a gate electrode. The first electrode may receive the data voltage DATA. The second electrode may be connected to the first transistor T1. The gate electrode may receive the first gate signal SC. The second transistor T2 may transmit the data voltage DATA in response to the first gate signal SC.

The third transistor T3 may include a first electrode, a second electrode, and a gate electrode. The first electrode may be connected to the first transistor T1. The second electrode may receive the initialization voltage VINT. The gate electrode may receive the second gate signal SS. The third transistor T3 may transmit the initialization voltage VINT in response to the second gate signal SS.

The storage capacitor CST may include a first electrode and a second electrode. The first electrode may be connected to the gate electrode of the first transistor T1. The second electrode may be connected to the first electrode of the third transistor T3. The storage capacitor CST may maintain a voltage level of the gate electrode of the first transistor T1 during an inactive period of the first gate signal SC.

The light emitting element LD may include a first electrode and a second electrode. The first electrode may be connected to the second electrode of the first transistor T1. The second electrode may receive the common voltage ELVSS. The light emitting element LD may emit light having luminance corresponding to the driving current. The light emitting element LD may include an organic light emitting element using an organic material as a light emitting layer, an inorganic light emitting element using an inorganic material as a light emitting layer, etc.

Figure 4:
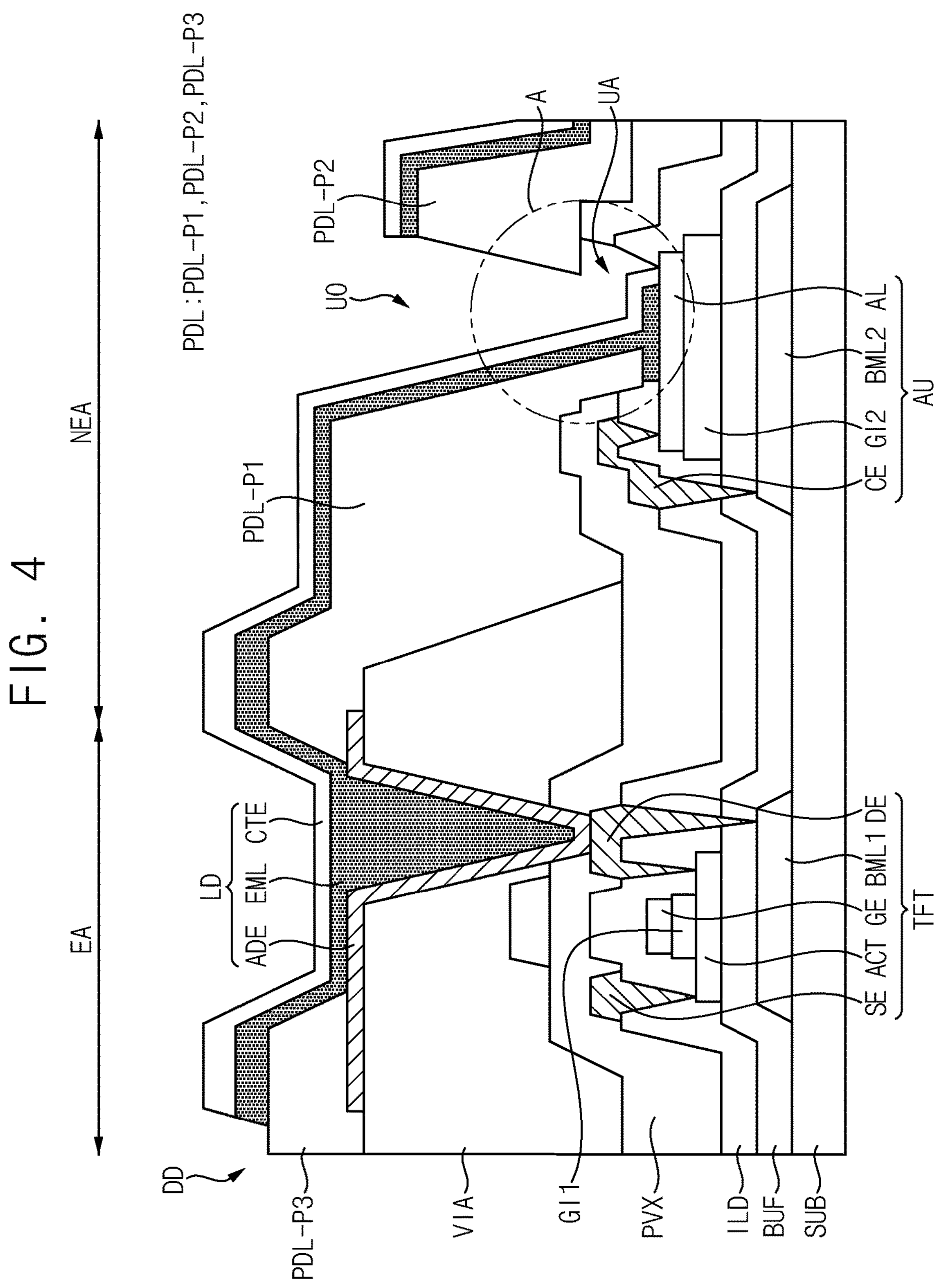
FIG. 4 is a cross-sectional view illustrating the display device of FIG. 1.

FIG. 4 is a cross-sectional view illustrating the display device of FIG. 1.

Referring to FIG. 4, the display device DD according to an embodiment of the present disclosure may include a substrate SUB, a buffer layer BUF, a first gate insulating layer GI1, a second gate insulating layer GI2, a thin film transistor TFT, an auxiliary unit AU, an interlayer insulating layer ILD, a protection layer PVX, a via insulating layer VIA, a pixel defining layer PDL, the light emitting element LD, and an encapsulation layer. The thin film transistor TFT may include a first lower pattern BML1, an active pattern ACT, a gate electrode GE, a source electrode SE, and a drain electrode DE. The auxiliary unit AU may include a second lower pattern BML2, an auxiliary line AL, and a connection electrode CE. The light emitting element LD may include an anode electrode ADE, a light emitting layer EML and a cathode electrode CTE.

The substrate SUB may include a transparent material or an opaque material. The substrate SUB may be formed of a transparent resin substrate. A polyimide substrate may be mentioned as an example of the transparent resin substrate. In this case, the polyimide substrate may include a first organic layer, a first barrier layer, a second organic layer, etc. Alternatively, the substrate SUB may include a quartz substrate, a synthetic quartz substrate, a calcium fluoride substrate, a fluorine-doped quartz substrate, a soda-lime glass substrate, a non-alkali glass substrate, etc. These may be used alone or in combination with each other.

The first lower pattern BML1 may be disposed on the substrate SUB in the light emitting area EA. The first lower pattern BML1 may include a metal, an alloy, a metal nitride, a conductive metal oxide, a transparent conductive material, etc. Examples of material that may be used as the first lower pattern BML1 may include silver (Ag), an alloy including silver, molybdenum (Mo), an alloy including molybdenum, aluminum (Al), an alloy including aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide (ITO), indium zinc oxide (IZO), etc. These may be used alone or in combination with each other. In addition, the first lower pattern BML1 may be formed as a single layer or as multiple layers in combination with each other.

The second lower pattern BML2 may be disposed on the substrate SUB in the non-light emitting layer NEA. In an embodiment, the second lower pattern BML2 may include a metal, an alloy, a metal nitride, a conductive metal oxide, a transparent conductive material, etc. The second lower pattern BML2 may be formed together with the first lower pattern BML1.

The buffer layer BUF may be disposed on the substrate SUB and cover the first lower pattern BML1 and the second lower pattern BML2. The buffer layer BML may prevent diffusion of impurities such as oxygen and moisture from the substrate SUB to an upper structure of the substrate SUB. The buffer layer BUF may include an inorganic insulating material such as a silicon compound or a metal oxide. Examples of the inorganic insulating material that may be used for the buffer layer BUF may include silicon oxide ($SiO_x$), silicon nitride ($SiN_x$), silicon oxynitride ($SiO_xN_y$), silicon oxycarbide ($SiO_xC_y$), silicon carbonitride ($SiC_xN_y$), aluminum oxide (AlO), aluminum nitride (AlN), tantalum oxide (TaO), hafnium oxide (HfO), zirconium oxide (ZrO), titanium oxide (TiO), etc. These may be used alone or in combination with each other. The buffer layer BUF may have a single-layer structure or a multi-layer structure including a plurality of insulating layers. A contact hole may be defined in the buffer layer BUF. The contact hole may expose a part of the first lower pattern BML1 in the light emitting layer EA and a part of the second lower pattern BML2 in the non-light emitting layer NEA.

The active pattern ACT may be disposed on the buffer layer BUF. The active pattern ACT may include an oxide semiconductor, a silicon semiconductor, an organic semiconductor, etc. For example, the oxide semiconductor may include at least one oxide of indium (In), gallium (Ga), tin (Sn), zirconium (Zr), vanadium (V), hafnium (Hf), cadmium (Cd), germanium (Ge), chromium (Cr), titanium (Ti) and zinc (Zn). The silicon semiconductor may include amorphous silicon, polycrystalline silicon, etc. The active layer ACT may include a source area, a drain area, and a channel area positioned between the source area and the drain area.

The first gate insulating layer GI1 may be disposed on the active pattern ACT in the light emitting area EA. The second gate insulating layer GI2 may be disposed on the buffer layer in the non-light emitting area NEA. The gate insulating layers GI1 and GI2 may be formed of an insulating material. Examples of the insulating material may include silicon oxide ($SiO_x$), silicon nitride ($SiN_x$), silicon oxynitride ($SiO_xN_y$), etc. These may be used alone or in combination with each other. The second gate insulating layer GI2 may be formed together with the first gate insulating layer GI1.

The gate electrode GE may be disposed on the first gate insulating layer GI1 in the light emitting area EA. The gate electrode GE may include a metal, an alloy, a metal nitride, a conductive metal oxide, a transparent conductive material, etc. Examples of material that may be used as the gate electrode GE may include silver (Ag), an alloy including silver, molybdenum (Mo), an alloy including molybdenum, aluminum (Al), an alloy including aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide (ITO), indium zinc oxide (IZO), etc. These may be used alone or in combination with each other.

The auxiliary line AL may be disposed on the second gate insulating layer GI2 in the non-light emitting area NEA. A common voltage (e.g., the common voltage ELVSS of FIG. 2) may be applied to the auxiliary line AL. The auxiliary line AL may include a metal, an alloy, a metal nitride, a conductive metal oxide, a transparent conductive material, etc. These may be used alone or in combination with each other. The auxiliary line AL may be formed together with the gate electrode GE.

In an embodiment, the auxiliary line AL may include a first conductive layer and a second conductive layer disposed on the first conductive layer. Each of the first conductive layer and the second conductive layer may include a metal. For example, the first conductive layer may include copper (Cu), and the second conductive layer may include titanium (Ti).

In another embodiment, the auxiliary line AL may further include a third conductive layer disposed on the second conductive layer. The third conductive layer may include a metal oxide. For example, the third conductive layer may include indium tin oxide (ITO).

The interlayer insulating layer ILD may be disposed on the buffer layer BUF and the gate insulating layers GI1 and GI2. The interlayer insulating layer ILD may cover the gate electrode GE in the light emitting area EA. A contact hole may be defined in the interlayer insulating layer ILD. The contact hole may expose a part of the active pattern ACT in the light emitting area EA and a part of the auxiliary line AL in the non-light emitting area NEA. In addition, the interlayer insulating layer ILD may define an undercut opening UO exposing a part of an upper surface of the auxiliary line AL in the non-light emitting area NEA. The interlayer insulating layer ILD may include an inorganic insulating material. In an embodiment, the interlayer insulating layer ILD may include silicon nitride ($SiN_x$), silicon oxynitride (SiON), silicon oxide ($SiO_2$), etc. These may be used alone or in combination with each other.

The source electrode SE and the drain electrode DE may be disposed on the interlayer insulating layer ILD in the light emitting area EA. The source electrode SE may be electrically connected to the active pattern ACT through a contact hole formed in the interlayer insulating layer ILD. The drain electrode DE may be electrically connected to the active pattern ACT through a contact hole formed in the interlayer insulating layer ILD. In addition, the drain electrode DE may be electrically connected to the first lower pattern BML1 through a contact hole formed in the interlayer insulating layer ILD and the buffer layer BUF. In an embodiment, each of the source electrode SE and the drain electrode DE may include a plurality of conductive layers.

The connection electrode CE may be disposed on the interlayer insulating layer ILD in the non-light emitting area NEA. The connection electrode CE may be electrically connected to the auxiliary line AL through a contact hole formed in the interlayer insulating layer ILD. In addition, the connection electrode CE may be electrically connected to the second lower pattern BML2 through a contact hole formed in the interlayer insulating layer ILD and the buffer layer BUF. In an embodiment, the connection electrode CE may include a plurality of conductive layers. The connection electrode CE may be formed together with the source electrode SE and the drain electrode DE.

The first lower pattern BML1, the active pattern ACT, the gate electrode GE, the source electrode SE, and the drain electrode DE may configure the thin film transistor TFT. For example, the thin film transistor TFT may correspond to at least one of the first, second, and third transistors T1, T2, and T3 described with reference to FIG. 3.

The second lower pattern BML2, the auxiliary line AL, and the connection electrode CE may configure the auxiliary unit AU. A common voltage (e.g., the common voltage ELVSS of FIG. 2) may be applied to the auxiliary line AL, and the cathode electrode CTE may contact the upper surface of the auxiliary line AL in an undercut area UA in the undercut opening UO. Accordingly, a voltage drop of the voltage provided to the cathode electrode CTE may be prevented.

The protection layer PVX may be disposed on the interlayer insulating layer ILD. The protection layer PVX may cover the source electrode SE and the drain electrode DE in the light emitting area EA. The protection layer PVX may cover the connection electrode CE in the non-light emitting area NEA. In addition, the protection layer PVX may define the undercut opening UO exposing a part of the upper surface of the auxiliary line AL in the non-light emitting area NEA. The protection layer PVX may include an inorganic insulating material. In an embodiment, the protection layer PVX may include silicon nitride ($SiN_x$), silicon oxynitride (SiON), silicon oxide ($SiO_2$), etc. These may be used alone or in combination with each other. In addition, the protection layer PVX may be configured to a single layer or multiple layers.

In an embodiment, the interlayer insulating layer ILD and the protection layer PVX may include the same inorganic material as each other. In another embodiment, the interlayer insulating layer ILD and the protection layer PVX may include inorganic material different from each other.

The via insulating layer VIA may be disposed on the protection layer PVX in the light emitting area EA. The via insulating layer VIA may not overlap the auxiliary line AL in a plane in the non-light emitting area NEA. The via insulating layer VIA may include an organic insulating material. Examples of organic insulating material that may be used as the via insulating layer VIA may include photoresist, polyacryl-based resin, polyimide-based resin, acryl-based resin, etc. These may be used alone or in combination with each other.

The anode electrode ADE may be disposed on the via insulating layer VIA. The anode electrode ADE may be connected to the drain electrode DE through a contact hole formed in the via insulating layer VIA. Accordingly, the anode electrode ADE may be electrically connected to the thin film transistor TFT. For example, the anode electrode ADE may correspond to the first electrode of the light emitting element LD described with reference to FIG. 3. The anode electrode ADE may include a metal, an alloy, a metal nitride, a conductive metal oxide, a transparent conductive material, etc.

The pixel defining layer PDL may be disposed on the via insulating layer VIA and the protection layer PVX. The pixel defining layer PDL may include an organic insulating material. Examples of organic insulating material that may be used as the pixel defining layer PDL may include photoresist, polyacryl-based resin, polyimide-based resin, acryl-based resin, etc. These may be used alone or in combination with each other. The pixel defining layer may include a first portion PDL-P1, a second portion PDL-P2, and a third portion PDL-P3.

The first portion PDL-P1 of the pixel defining layer PDL may be disposed on the via insulating layer VIA and the anode electrode ADE in the light emitting area EA, and may be disposed on the protection layer PVX in the non-light emitting area NEA. The first portion PDL-P1 of the pixel defining layer PDL may cover a part of a first side surface (e.g., a first side surface ILD-P1 of FIG. 5) of the interlayer insulating layer ILD in the non-light emitting area NEA. In addition, the first portion PDL-P1 of the pixel defining layer PDL may cover a first protection side surface (e.g., a first protection side surface PVX-P1 of FIG. 5) of the protection layer PVX in the non-light emitting area NEA. This will be described later with reference to FIG. 5.

The second portion PDL-P2 of the pixel defining layer PDL may be disposed on the protection layer PVX in the non-light emitting area NEA. The second portion PDL-P2 of the pixel defining layer PDL may protrude toward the first portion PDL-P1 of the pixel defining layer PDL beyond the edge of a second side surface (e.g., a second side surface ILD-P2 of FIG. 5) of the interlayer insulating layer ILD and a second protection side surface (e.g., a second protection side surface PVX-P2 of FIG. 5) of the protection layer PVX. The second portion PDL-P2 of the pixel defining layer PDL may define the undercut area UA together with the second side surface of the interlayer insulating layer ILD and the second protection side surface of the protection layer PVX in the non-light emitting area NEA. This will be described later with reference to FIGS. 5 and 6.

The third portion PDL-P3 of the pixel defining layer PDL may be disposed on the via insulating layer VIA and the anode electrode ADE in the light emitting area EA. The first portion PDL-P1 of the pixel defining layer PDL and the third portion PDL-P3 of the pixel defining layer PDL may cover the periphery of the anode electrode ADE and may define a pixel opening exposing a central part of the anode electrode ADE in the light emitting area EA.

The light emitting layer EML may be disposed on the anode electrode ADE in the light emitting area EA. The light emitting layer EML may be disposed on the first portion PDL-P1 of the pixel defining layer PDL, the second portion PDL-P2 of the pixel defining layer PDL, and the auxiliary line AL in the non-light emitting area NEA. Specifically, the light emitting layer EML disposed on the upper surface of the auxiliary line AL and the first portion PDL-P1 of the pixel defining layer PDL may not be connected to the light emitting layer EML disposed on the second portion PDL-P2 of the pixel defining layer PDL.

The light emitting layer EML may extend to at least a part of the upper surface of the auxiliary line AL, and may expose the upper surface of the auxiliary line AL in the undercut area UA. In an embodiment, the light emitting layer EML may extend to at least a part of the upper surface of the auxiliary line AL so as to contact a part of the first side surface of the interlayer insulating layer ILD exposed by the first portion PDL-P1 of the pixel defining layer PDL. The light emitting layer EML may have a multi-layer structure including a hole injection layer, a hole transport layer, an organic light emitting layer, an electron transport layer, and an electron injection layer, etc.

The cathode electrode CTE may be disposed on the light emitting layer EML in the light emitting area EA and the non-light emitting area NEA. The cathode electrode CTE may extend to the undercut area UA and contact the upper surface of the auxiliary line AL in the undercut area UA. Specifically, the cathode electrode CTE may include a first portion and a second portion. The first portion of the cathode electrode CTE may overlap the first portion PDL-P1 of the pixel defining layer PDL on a plane, and the second portion of the cathode electrode CTE may overlap the second portion PDL-P2 of the pixel defining layer PDL on a plane. Here, the first portion of the cathode electrode CTE may not be connected to the second portion of the cathode electrode CTE.

Specifically, the first portion of the cathode electrode CTE overlapping the first portion PDL-P1 of the pixel defining layer PDL on a plane may not be connected to the second portion of the cathode electrode CTE overlapping the second portion PDL-P2 of the pixel defining layer PDL. For example, the cathode electrode CTE may correspond to the second electrode of the light emitting element LD described with reference to FIG. 3. The cathode electrode may include a metal, an alloy, a metal nitride, a conductive metal oxide, a transparent conductive material, etc. The anode electrode ADE, the light emitting layer EML, and the cathode electrode CTE may configure the light emitting element LD.

The encapsulation layer may be disposed on the cathode electrode CTE. The encapsulation layer may prevent impurities, moisture, and the like from permeating into the light emitting element LD from the outside. The encapsulation layer may include at least one inorganic encapsulation layer and at least one organic encapsulation layer.

Figure 5:
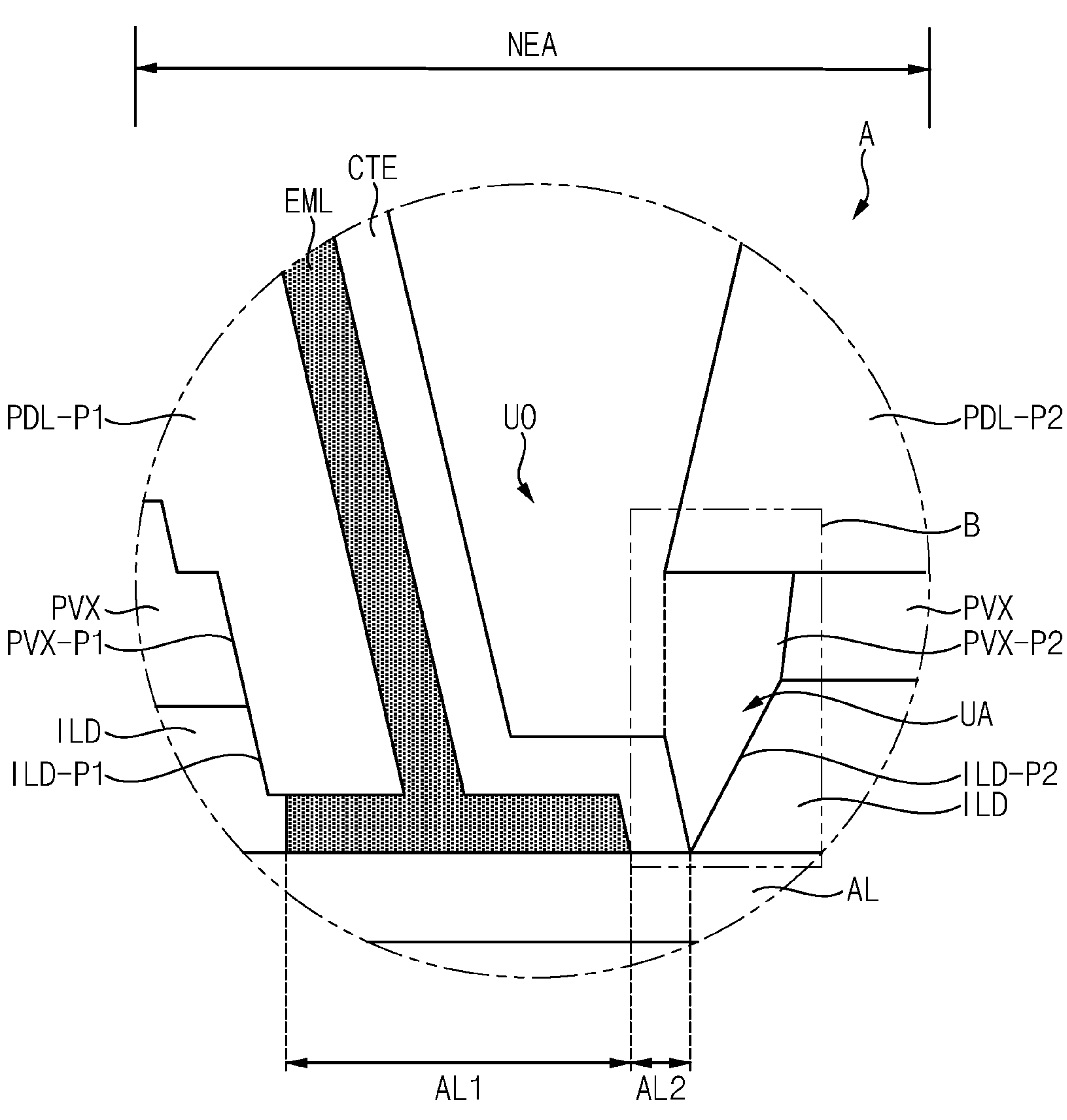
FIG. 5 is an enlarged cross-sectional view of part 'A' of FIG. 4.
Figure 6:
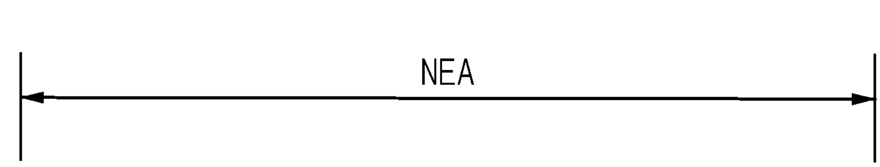
FIG. 6 is an enlarged cross-sectional view of part 'B' of FIG. 5.
Figure 6:
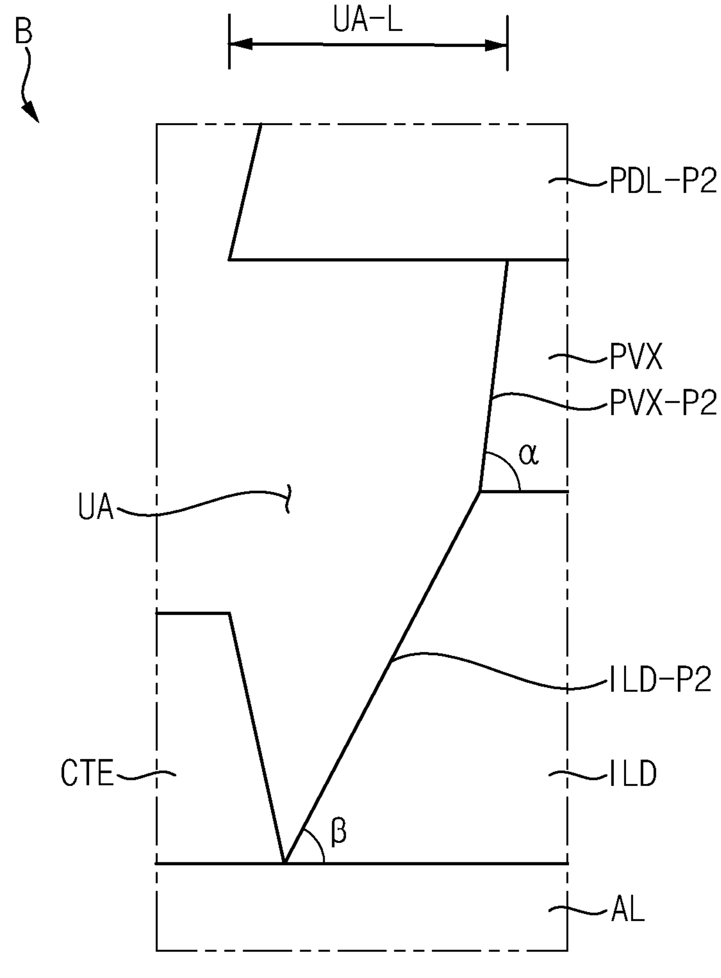

FIG. 5 is an enlarged cross-sectional view of part 'A' of FIG. 4. FIG. 6 is an enlarged cross-sectional view of part 'B' of FIG. 5.

Referring to FIGS. 5 and 6, the display device may include the auxiliary line AL, the interlayer insulating layer ILD, the protection layer PVX, the pixel defining layer PDL, the light emitting layer EML, and the cathode electrode CTE. Here, the pixel defining layer PDL may include the first portion PDL-P1 and the second portion PDL-P2.

The auxiliary line AL may include a first auxiliary line area AL1 in contact with the light emitting layer EML and a second auxiliary line area AL2 in contact with the cathode electrode CTE.

The interlayer insulating layer ILD may be disposed on the auxiliary line AL. The interlayer insulating layer ILD may include a first side surface ILD-P1 adjacent to the first auxiliary line area AL1 and a second side surface ILD-P2 adjacent to the second auxiliary line area AL2. The first side surface ILD-P1 of the interlayer insulating layer ILD may face the second side surface ILD-P2 of the interlayer insulating layer ILD. The interlayer insulating layer ILD may define the undercut opening UO exposing a part of the upper surface of the auxiliary line AL.

The protection layer PVX may be disposed on the interlayer insulating layer ILD. The protection layer PVX may include a first side surface PVX-P1 adjacent to the first side surface ILD-P1 of the interlayer insulating layer ILD and a second side surface PVX-P2 adjacent to the second side surface ILD-P2 of the interlayer insulating layer ILD. The first side surface PVX-P1 of the protection layer PVX may face the second side surface PVX-P2 of the protection layer PVX. The protection layer PVX may define the undercut opening UO exposing a part of the upper surface of the auxiliary line AL.

As illustrated in FIG. 6, in an embodiment, an inclination angle β formed between the second side surface ILD-P2 of the interlayer insulating layer ILD and the auxiliary line AL may be different from an inclination angle α formed between the second protection side surface PVX-P2 of the protection layer PVX and the auxiliary line AL. In the process of simultaneously forming the interlayer insulating layer ILD and the protection layer PVX through an etching process, an etch rate of the interlayer insulating layer ILD and an etch rate of the protection layer PVX may be different from each other. In this case, the inclination angle β formed between the second side surface ILD-P2 of the interlayer insulating layer ILD and the auxiliary line AL may be different from the inclination angle α formed between the second protection side surface PVX-P2 of the protection layer PVX and the auxiliary line AL.

The first portion PDL-P1 of the pixel defining layer PDL may be disposed on the protection layer PVX. The first portion PDL-P1 of the pixel defining layer PDL may cover a part of the first side surface ILD-P1 of the interlayer insulating layer ILD. In addition, the first portion PDL-P1 of the pixel defining layer PDL may cover the first protection side surface PVX-P1 of the protection layer PVX. In an embodiment, the first portion PDL-P1 of the pixel defining layer PDL may be spaced apart from the upper surface of the auxiliary line AL.

The second portion PDL-P2 of the pixel defining layer PDL may be disposed on the protection layer PVX. The second portion PDL-P2 of the pixel defining layer PDL may protrude more toward the first portion PDL-P1 of the pixel defining layer PDL than the second side surface ILD-P2 of the interlayer insulating layer ILD and the second protection side surface PVX-P2 of the protection layer PVX. The second portion PDL-P2 of the pixel defining layer PDL may define the undercut area UA together with the second side surface ILD-P2 of the interlayer insulating layer ILD and the second protection side surface PVX-P2 of the protection layer PVX.

In an embodiment, a width UA-L of a protruding part of the second portion PDL-P2 of the pixel defining layer PDL defining the undercut area UA may be about 0.1 μm to about 5.0 μm. When the width UA-L of the protruding part of the second portion PDL-P2 of the pixel defining layer PDL is less than about 0.1 μm, the light emitting layer EML may cover the upper surface of the auxiliary line AL in the undercut area UA. That is, the cathode electrode CTE may not contact the upper surface of the auxiliary line AL in the undercut area UA. When the width UA-L of the protruding part of the second portion PDL-P2 of the pixel defining layer PDL is greater than about 5.0 μm, the protruding part may be separated from the second portion PDL-P2 of the pixel defining layer PDL. The protruding part separated from the second portion PDL-P2 of the pixel defining layer PDL may cover a part of the upper surface of the auxiliary line AL adjacent to the undercut area UA. Accordingly, the cathode electrode CTE may be blocked by the protruding part, so that the cathode electrode CTE may not contact the upper surface of the auxiliary line AL in the undercut area UA.

The light emitting layer EML may cover the first portion PDL-P1 of the pixel defining layer PDL, extend to the first auxiliary line area AL1 of the auxiliary line AL, and expose the upper surface of the auxiliary line AL in the undercut area UA. That is, the light emitting layer EML may extend to at least a part of the upper surface of the auxiliary line AL so as to contact a part of the first side surface ILD-P1 of the interlayer insulating layer ILD exposed by the first portion PDL-P1 of the pixel defining layer PDL. In addition, the light emitting layer EML may not contact the auxiliary line AL in the second auxiliary line area AL2.

In an embodiment, the sum of a thickness of the interlayer insulating layer ILD and a thickness of the protection layer PVX may be greater than a thickness of the light emitting layer EML. When the sum of the thickness of the interlayer insulating layer ILD and the thickness of the protection layer PVX is smaller than the thickness of the light emitting layer EML, the light emitting layer EML may continuously extend from the upper surface of the auxiliary line AL to at least a part of an upper surface of the second portion PDL-P2 of the pixel defining layer PDL to cover the undercut area UA. In this case, the cathode electrode CTE may be blocked by the light emitting layer EML and may not contact the upper surface of the auxiliary line AL.

The cathode electrode CTE may be disposed on the light emitting layer EML, extend to the undercut area UA, and contact the upper surface of the auxiliary line AL in the undercut area UA. That is, the cathode electrode CTE may contact the upper surface of the auxiliary line AL in the second auxiliary line area AL2.

In addition, although the display device DD of the present disclosure is described by limiting the organic light emitting display device ("OLED"), the configuration of the present disclosure is not limited thereto. In other embodiments, the display device DD may include a liquid crystal display device ("LCD"), a field emission display device ("FED"), a plasma display device ("PDP"), an electrophoretic image display device ("EPD"), an inorganic light emitting display device ("ILED"), or a quantum dot display device.

FIGS. 7, 8, 9, 10, 11, 12, and 13 are cross-sectional views illustrating a method of manufacturing a display device according to an embodiment of the present disclosure.

In the method of manufacturing the display device of the present disclosure, detailed descriptions of the formation of the thin film transistor and the light emitting element in the light emitting area will be omitted. That is, the method of manufacturing the display device according to an embodiment of the present disclosure will mainly describe the non-light emitting area NEA.

Figure 7:
FIGS. 7, 8, 9, 10, 11, 12, and 13 are cross-sectional views illustrating a method of manufacturing a display device according to an embodiment of the present disclosure.
Figure 7:
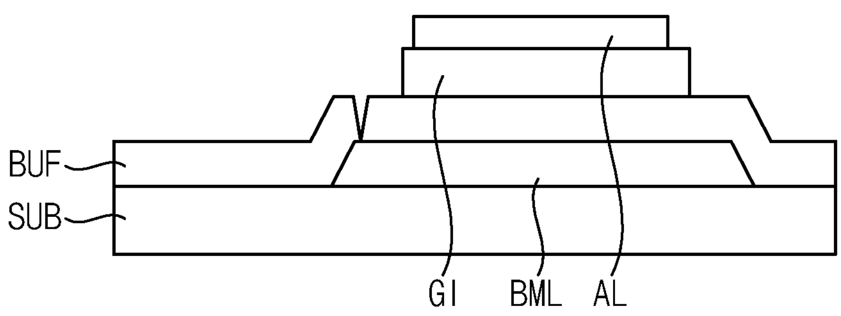

Referring to FIG. 7, a lower pattern BML may be formed on the substrate SUB. The substrate SUB may include a transparent material or an opaque material. The lower pattern BML may be formed using a metal, an alloy, a metal nitride, a conductive metal oxide, a transparent conductive material, etc.

The buffer layer BUF covering the lower pattern BML may be formed on the substrate SUB. A contact hole exposing a part of the lower pattern BML may be formed in the buffer layer BUF. The buffer layer BUF may include an inorganic insulating material such as a silicon compound, a metal oxide, etc.

A gate insulating layer GI may be formed on the buffer layer BUF. The gate insulating layer GI may be formed using an insulating material. Examples of the insulating material may include silicon oxide, silicon nitride, silicon oxynitride, etc. These may be used alone or in combination with each other.

The auxiliary line AL may be formed on the gate insulating layer GI. The auxiliary line AL may be formed using a metal, an alloy, a metal nitride, a conductive metal oxide, a transparent conductive material, etc. A common voltage (e.g., the common voltage ELVSS of FIG. 2) may be applied to the auxiliary line AL.

Figure 8:
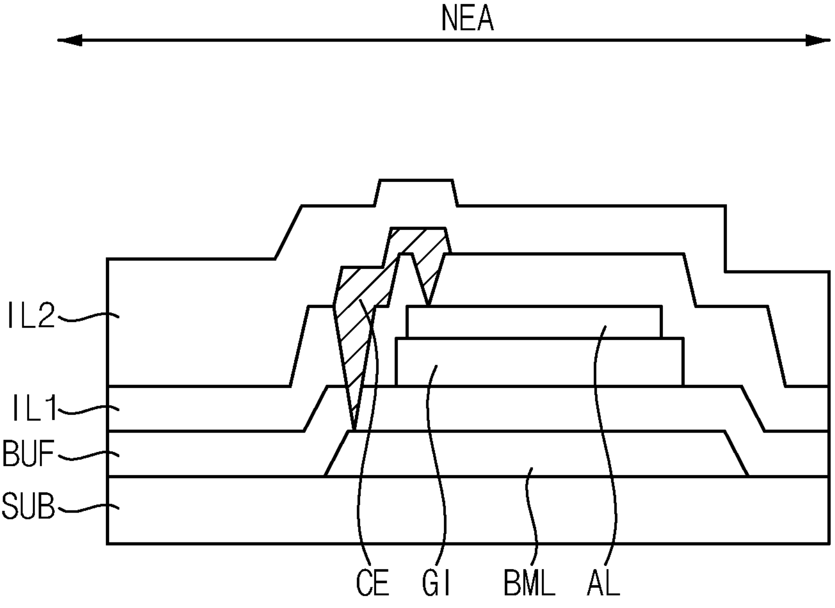

Referring further to FIG. 8, a first insulating layer IL1 may be formed on the buffer layer BUF. The first insulating layer IL1 may be formed using an inorganic insulating material. In an embodiment, the first insulating layer IL1 may include silicon nitride ($SiN_x$), silicon oxynitride (SiON), silicon oxide ($SiO_2$), etc. These may be used alone or in combination with each other. A contact hole exposing a part of the lower pattern BML may be formed in the first insulating layer IL1. In addition, a contact hole exposing a part of the auxiliary line AL may be formed in the first insulating layer IL1.

The connection electrode CE may be formed on the first insulating layer IL1. The connection electrode CE may be electrically connected to the auxiliary line AL through a contact hole formed in the first insulating layer IL1. In addition, the connection electrode CE may be electrically connected to the lower pattern BML through a contact hole formed in the first insulating layer IL1 and the buffer layer BUF. For example, the connection electrode CE may include a plurality of conductive layers.

A second insulating layer IL2 may be formed on the first insulating layer IL1. The second insulating layer IL2 may be formed using an inorganic insulating material. In an embodiment, the second insulating layer IL2 may include silicon nitride ($SiN_x$), silicon oxynitride (SiON), silicon oxide ($SiO_2$), etc.

Figure 9:
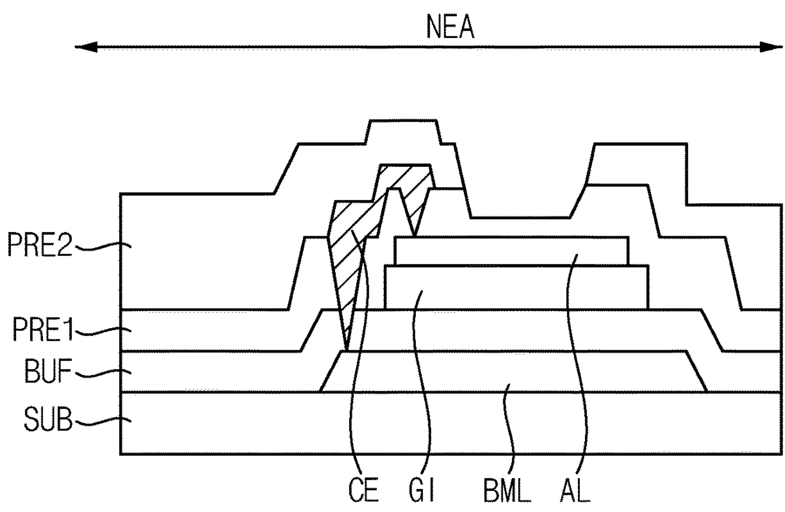

Referring further to FIG. 9, each of a part of the first insulating layer IL1 and a part of the second insulating layer IL2 covering a part of the auxiliary line AL may be removed through a first etching process. In other words, each of a part of the first insulating layer IL1 and a part of the second insulating layer IL2 overlapping a part of the auxiliary line AL may be removed by reacting with an etchant. Accordingly, a first preliminary layer PRE1 and a second preliminary layer PRE2 may be formed. The first etching process may be a dry etching process.

In an embodiment, the first preliminary layer PRE1 may be formed by removing the part of the first insulating layer IL1 that is above the auxiliary line AL. In this case, the first preliminary layer PRE1 may entirely cover the upper surface of the auxiliary line AL. When the auxiliary line AL includes copper (Cu), copper oxide ($CuO_x$) may be formed when the upper surface of the auxiliary line AL is exposed to oxygen. To prevent this, the auxiliary line AL may be protected from oxygen by forming the first preliminary layer PRE1 to cover the upper surface of the auxiliary line AL. In this case, an etch time may be adjusted to remove only a part of the first insulating layer IL1 overlapping a part of the auxiliary line AL.

Figure 10:
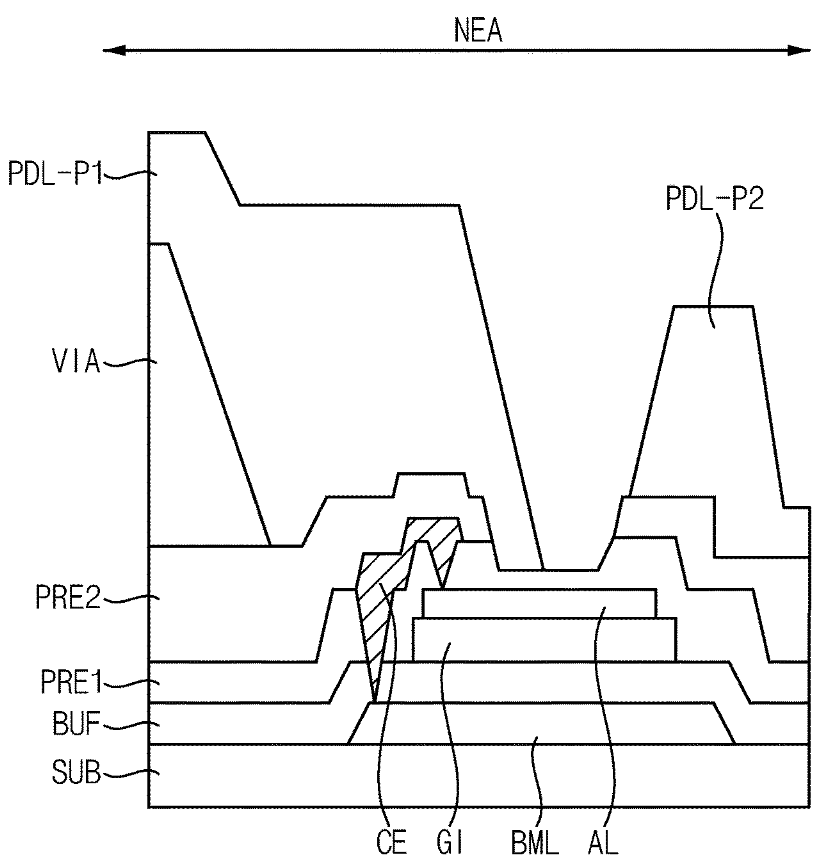

Referring further to FIG. 10, the via insulating layer VIA may be formed on the second preliminary layer PRE2. The via insulating layer VIA may be formed using an organic insulating material. Examples of the organic insulating material may include photoresist, polyacryl-based resin, polyimide-based resin, acryl-based resin, etc. These may be used alone or in combination with each other.

The pixel defining layer PDL may be formed on the via insulating layer VIA and the second preliminary layer PRE2. The pixel defining layer PDL may be formed using an organic insulating material. The pixel defining layer PDL may include the first portion PDL-P1 and the second portion PDL-P2. The first portion PDL-P1 of the pixel defining layer PDL may be disposed on the via insulating layer VIA and the second preliminary layer PRE2, and may cover one side surface of each of the first preliminary layer PRE1 and the second preliminary layer PRE2. The second portion PDL-P2 of the pixel defining layer PDL may be disposed on the second preliminary layer PRE2.

In an embodiment, the first portion PDL-P1 of the pixel defining layer PDL may be spaced apart from the upper surface of the auxiliary line AL. When only a part of the first insulating layer IL1 overlapping a part of the auxiliary line AL is removed in the first etching process, the first portion PDL-P1 of the pixel defining layer PDL may contact a part of the first insulating layer IL1. In other words, the first portion PDL-P1 of the pixel defining layer PDL may contact the first preliminary layer PRE1 formed by removing a part of the first insulating layer IL1. As a result, the first portion PDL-P1 of the pixel defining layer PDL may be spaced apart from the upper surface of the auxiliary line AL.

Figure 11:
Figure 11:
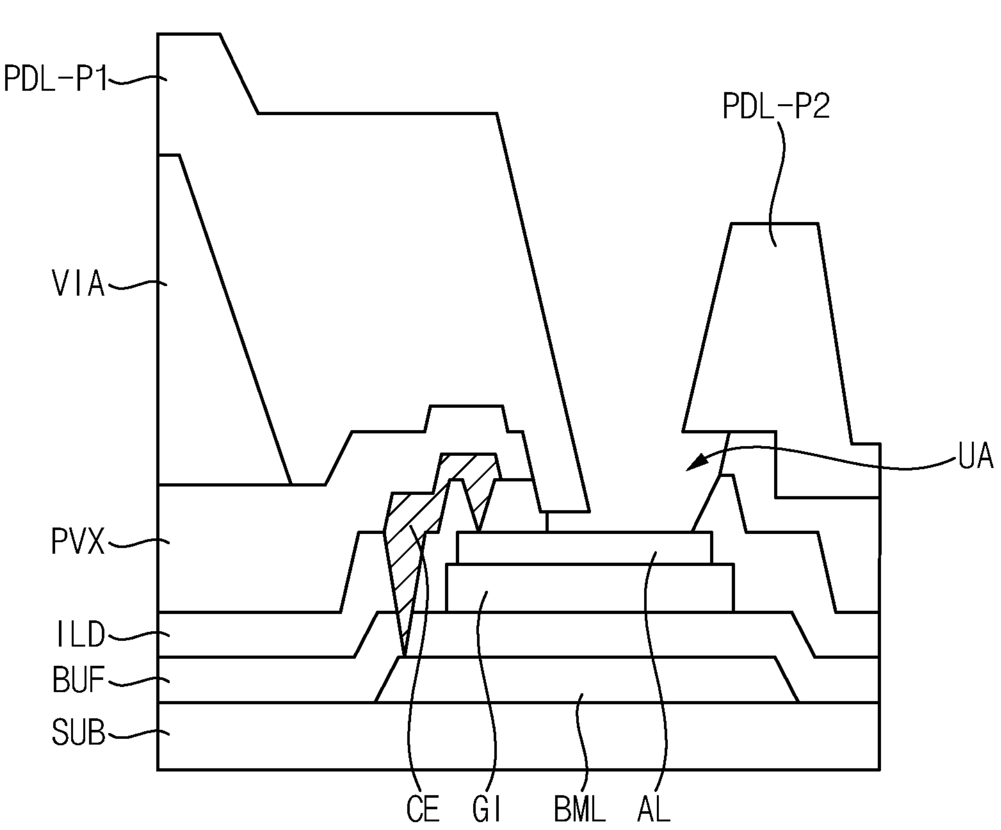

Referring further to FIG. 11, a part of the first preliminary layer PRE1 contacting the upper surface of the auxiliary line AL and a part of the first preliminary layer PRE1 and the second preliminary layer PRE2 that is covered by an end of the second portion PDL-P2 of the pixel defining layer PDL may be removed through a second etching process. In other words, a part of the first preliminary layer PRE1 contacting the upper surface of the auxiliary line AL and a part of the first preliminary layer PRE1 and the second preliminary layer PRE2 that is covered by an end of the second portion PDL-P2 of the pixel defining layer PDL may be removed by reacting with an etchant. Accordingly, the interlayer insulating layer ILD and the protection layer PVX exposing a part of the upper surface of the auxiliary line AL may be formed. In addition, one side surface of each of the interlayer insulating layer ILD and the protection layer PVX adjacent to the second portion PDL-P2 of the pixel defining layer PDL may define the undercut area UA together with the second portion PDL-P2 of the pixel defining layer PDL. In addition, the other side surface of the interlayer insulating layer ILD adjacent to the first portion PDL-P1 of the pixel defining layer PDL may be covered by the first portion PDL-P1 of the pixel defining layer PDL. The second etching process may be a wet etching process.

In an embodiment, an inclination angle formed between the one side surface of the interlayer insulating layer ILD adjacent to the second portion PDL-P2 of the pixel defining layer PDL and the auxiliary line AL may be different from an inclination angle formed between the one protection side surface of the protection layer PVX adjacent to the second portion PDL-P2 of the pixel defining layer PDL and the auxiliary line AL. In the process of simultaneously forming the interlayer insulating layer ILD and the protection layer PVX through the second etching process, the etching rate of the interlayer insulating layer ILD and the etching rate of the protection layer PVX may be different from each other. In this case, the inclination angle formed between the one side surface of the interlayer insulating layer ILD and the auxiliary line AL may be different from the inclination angle formed between the one protection side surface of the protection layer PVX and the auxiliary line AL.

In an embodiment, the interlayer insulating layer ILD and the protection layer PVX may include an inorganic material different from each other. In another embodiment, the interlayer insulating layer ILD and the protection layer PVX may include the same inorganic material as each other.

Figure 12:
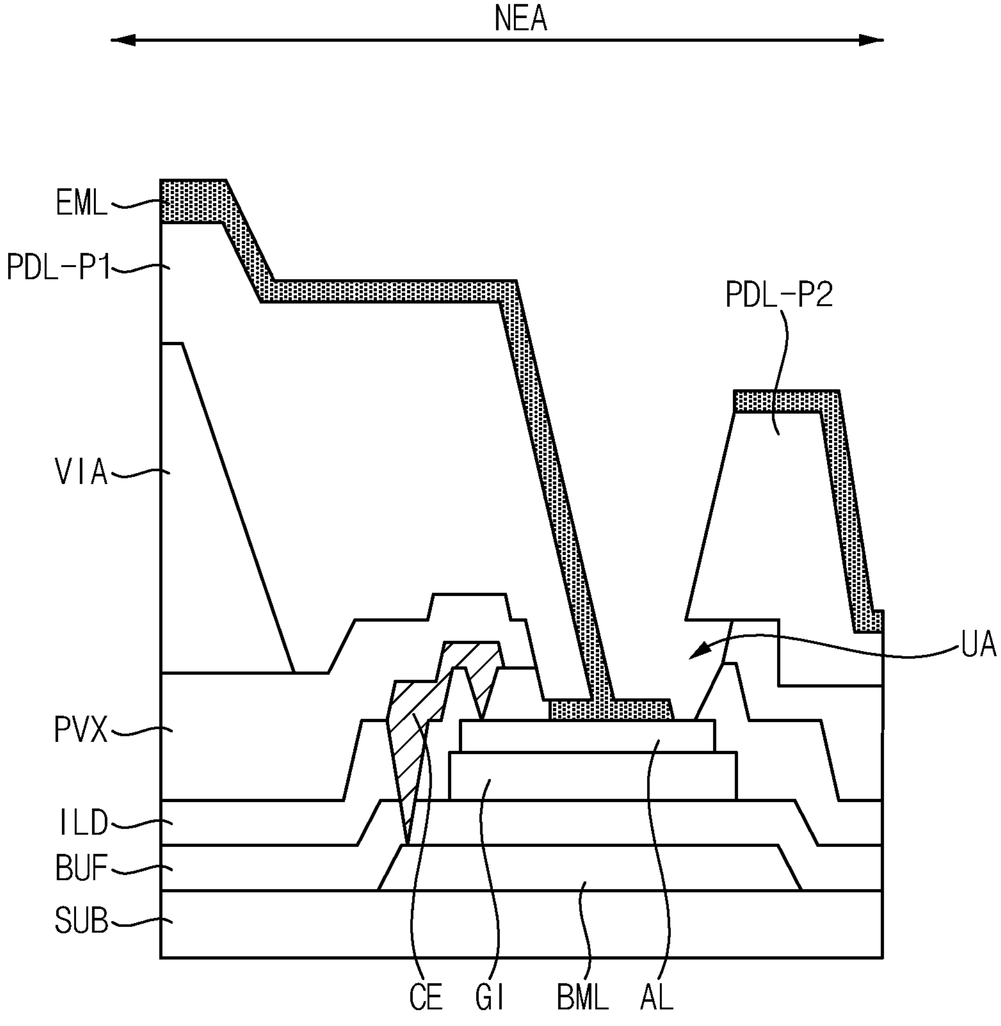

Referring further to FIG. 12, the light emitting layer EML may be formed on the first portion PDL-P1 of the pixel defining layer PDL, the second portion PDL-P2 of the pixel defining layer PDL, and the auxiliary line AL. Specifically, the light emitting layer EML disposed on the upper surface of the auxiliary line AL and the first portion PDL-P1 of the pixel defining layer PDL may not be connected to the light emitting layer EML disposed on the second portion PDL-P2 of the pixel defining layer PDL.

The light emitting layer EML may extend to at least a part of the upper surface of the auxiliary line AL, and may be formed to expose the upper surface of the auxiliary line AL in the undercut area UA. In an embodiment, the light emitting layer EML may extend to at least a part of the upper surface of the auxiliary line AL and contact a part of the other side surface of the interlayer insulating layer ILD exposed by the first portion PDL-P1 of the pixel defining layer PDL. The light emitting layer EML may have a multi-layer structure including a hole injection layer, a hole transport layer, an organic light emitting layer, an electron transport layer, and an electron injection layer, etc.

In an embodiment, the sum of the thickness of the interlayer insulating layer ILD and the thickness of the protection layer PVX may be greater than the thickness of the light emitting layer EML.

Figure 13:
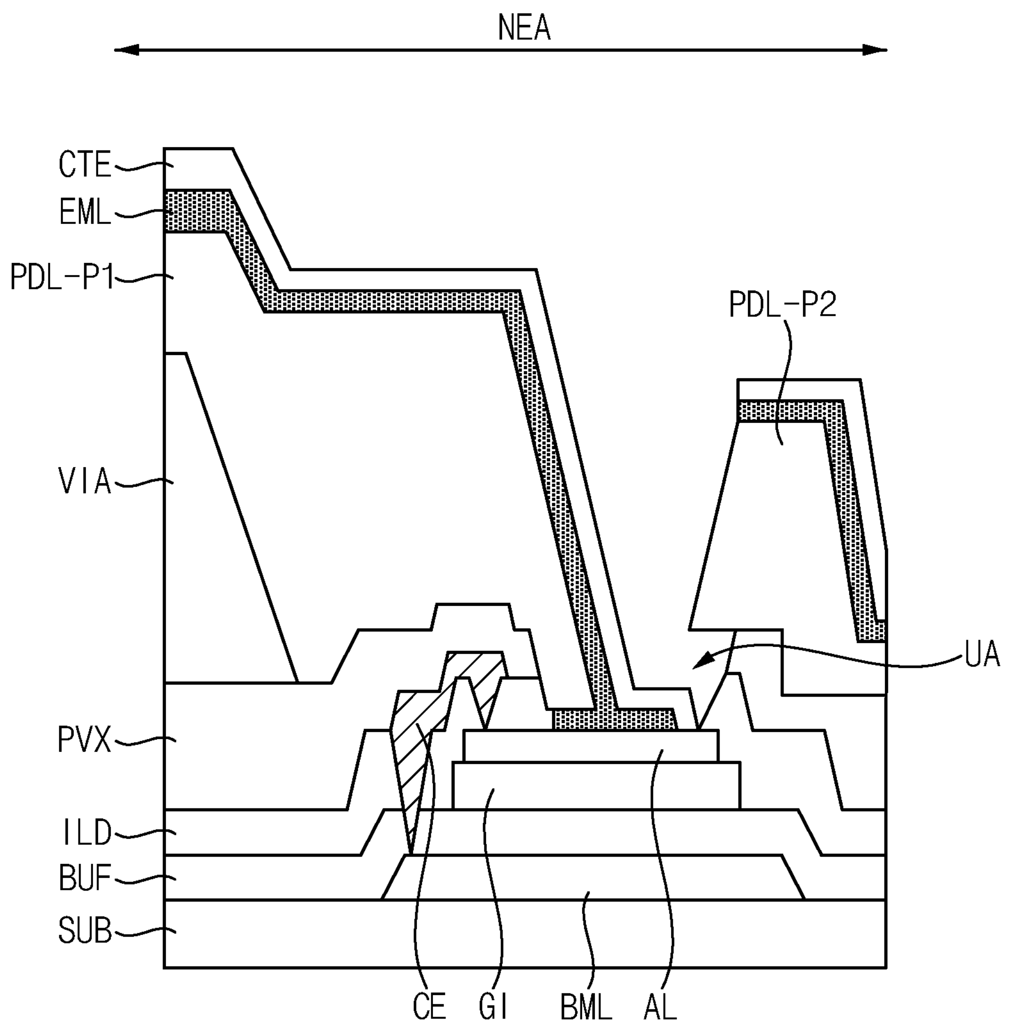

Referring further to FIG. 13, the cathode electrode CTE may be formed on the light emitting layer EML. The cathode electrode CTE may extend to the undercut area UA and contact the upper surface of the auxiliary line AL in the undercut area UA. Specifically, the cathode electrode CTE may include a first portion and a second portion. The first portion of the cathode electrode CTE may overlap the first portion PDL-P1 of the pixel defining layer PDL on a plane, and the second portion of the cathode electrode CTE may overlap the second portion PDL-P2 of the pixel defining layer PDL on a plane. Here, the first portion of the cathode electrode CTE may not be connected to the second portion of the cathode electrode CTE. The cathode electrode CTE may be formed using a metal, an alloy, a metal nitride, a conductive metal oxide, a transparent conductive material, etc.

The encapsulation layer may be formed on the cathode electrode CTE. The encapsulation layer may prevent impurities, moisture, and the like from permeating into the light emitting element (e.g., the light emitting element LD of FIG. 4) from the outside. The encapsulation layer may include at least one inorganic encapsulation layer and at least one organic encapsulation layer.

The present disclosure can be applied to various display devices. For example, the present disclosure is applicable to various display devices such as display devices for vehicles, ships and aircraft, portable communication devices, display devices for exhibition or information transmission, medical display devices, and the like.

The foregoing is illustrative of the embodiments of the present disclosure, and is not to be construed as limiting thereof. Although a few embodiments have been described with reference to the figures, those skilled in the art will readily appreciate that many variations and modifications may be made therein without departing from the spirit and scope of the present disclosure as defined in the appended claims.

What is claimed is:

1. A display device comprising:

a substrate;

an auxiliary line disposed on the substrate;

an interlayer insulating layer covering an edge of the auxiliary line, the interlayer insulating layer removed from an area above the auxiliary line and including a first side surface and a second side surface facing each other;

a protection layer disposed on the interlayer insulating layer and removed from an area above the auxiliary line, and the protection layer including a first protection side surface and a second protection side surface facing each other;

a pixel defining layer disposed on the protection layer and including:

a first portion covering the first protection side surface of the protection layer and partially covering the first side surface of the interlayer insulating layer; and a second portion protruding toward the first portion beyond an edge of the second side surface of the interlayer insulating layer and an edge of the second protection side surface of the protection layer and defining an undercut area with the second side surface of the interlayer insulating layer and the second protection side surface of the protection layer;

a light emitting layer covering the first portion of the pixel defining layer and contacting a first part of the auxiliary line while leaving a second part of the auxiliary line in the undercut area free of the light emitting layer; and a cathode electrode disposed on the light emitting layer, extending to the undercut area, and contacting the auxiliary line in the undercut area.

2. The display device of claim 1, wherein a sum of a thickness of the interlayer insulating layer and a thickness of the protection layer is greater than a thickness of the light emitting layer.

3. The display device of claim 1, wherein an inclination angle formed between the second side surface of the interlayer insulating layer and the auxiliary line is different from an inclination angle formed between the second protection side surface of the protection layer and the auxiliary line.

4. The display device of claim 1, wherein each of the interlayer insulating layer and the protection layer includes at least one of silicon nitride ($SiN_x$), silicon oxide ($SiO_2$), and silicon oxynitride (SiON).

5. The display device of claim 4, wherein the interlayer insulating layer and the protection layer include an inorganic material different from each other.

6. The display device of claim 4, wherein the interlayer insulating layer and the protection layer include a same inorganic material as each other.

7. The display device of claim 1, wherein the first portion of the pixel defining layer is spaced apart from an upper surface of the auxiliary line.

8. The display device of claim 1, wherein the light emitting layer extends to at least a part of an upper surface of the auxiliary line and contacts a part of the first side surface of the interlayer insulating layer.

9. The display device of claim 1, wherein the auxiliary line includes a first conductive layer and a second conductive layer disposed on the first conductive layer, and each of the first conductive layer and the second conductive layer includes a metal.

10. The display device of claim 9, wherein the auxiliary line further includes a third conductive layer disposed on the second conductive layer, and the third conductive layer includes a metal oxide.

11. The display device of claim 1, wherein a width of a protruding part of the second portion of the pixel defining layer defining the undercut area is about 0.1 micrometers to about 5.0 micrometers.

* * * * *